United States Patent [19]
Manente et al.

[11] Patent Number: 5,660,627
[45] Date of Patent: Aug. 26, 1997

[54] METHOD OF GROWING LUTETIUM OXYORTHOSILICATE CRYSTALS

[75] Inventors: Ralph A. Manente, Monroe, Conn.; Frank Bruni, Santa Rosa, Calif.; Charles L. Melcher, West Redding, Conn.; Carl A. Peterson, Yonkers, N.Y.; Jeffrey S. Schweitzer, Ridgefield, Conn.

[73] Assignee: Schlumberger Technology Corporation, New York, N.Y.

[21] Appl. No.: 330,051

[22] Filed: Oct. 27, 1994

[51] Int. Cl.$^6$ .................................... C30B 15/20
[52] U.S. Cl. ........................ 117/13; 117/15; 117/19
[58] Field of Search ........................ 117/2, 13, 15, 117/19, 84; 250/361 R, 483.1; 252/301.4 F

[56] References Cited

U.S. PATENT DOCUMENTS

| | | | |
|---|---|---|---|
| 3,461,291 | 8/1969 | Goodman | 376/118 |
| 3,521,064 | 7/1970 | Moran et al. | 250/261 |
| 3,546,512 | 12/1970 | Frentrop | 376/109 |
| 4,012,712 | 3/1977 | Nelligan | 340/853.9 |
| 4,317,993 | 3/1982 | Hertzog, Jr. et al. | 250/269.8 |
| 4,444,728 | 4/1984 | Lanam et al. | 420/461 |
| 4,958,080 | 9/1990 | Melcher | 250/483.1 |
| 5,025,151 | 6/1991 | Melcher | 250/269.6 |

FOREIGN PATENT DOCUMENTS

| | | | |
|---|---|---|---|
| 0 493 903 A1 | 7/1992 | European Pat. Off. | C30B 15/00 |

OTHER PUBLICATIONS

T. Utsu and S. Akiyama, "Growth and Applications of $Gd_2SiO_5$: Ce Scintillators", *Journal of Crystal Growth 109* (1991) pp. 385–391.

C.L. Melcher, R.A. Manente, C. A. Peterson and J.S. Schweitzer, "Czochralski Growth of Rare Earth Oxyorthosilicate Single Crystals", *Journal of Crystal Growth 128* (1993) pp.1001–1005.

R.A. Manente, C.L. Melcher, C.A. Peterson, J.S. Schweitzer and M.A. Singelenberg, and F.J. Bruni, "Crystal Growth: A Macintosh-based System for Czochralski Crystal Growth", *Scientific Computing and Automation* (Jan. 1994), pp. 39–45.

Santos et al., "Flat Interface in the Growth of $LiNbO_3$,$Bi_{12}SiO_{20}$ and $Bi_{12}GeO_{20}$ Crystals from the Melt", *Journal of Crystal Growth*, 142 (1994) pp. 103–110.

Martinez–Lopez et al., "Solid Liquid Interface in the Growth of Sillenite–Type Crystals", *Journal of Crystal Growth*, 128 (1993) pp. 852–858.

*Primary Examiner*—Felisa Garrett
*Attorney, Agent, or Firm*—Brigitte L. Jeffery; Leonard W. Pojunas; Martin D. Hyden

[57] ABSTRACT

A method for producing lutetium oxyorthosilicate crystals includes maintaining the interface between a crystal and the melt from which it is pulled substantially flat as the crystal is grown. In a Czochralski growth method, the rate of rotation of the crystal and its diameter are typically controllable to provide the flat interface as the crystal is pulled. Crystals produced by this method exhibit less variability in scintillation behavior so making them particularly suitable for spectroscopic uses. Such crystals find uses in borehole logging tools.

12 Claims, 9 Drawing Sheets

METHOD OF GROWING LUTETIUM OXYORTHOSILICATE CRYSTALS

BACKGROUND OF THE INVENTION

1. Field of the Invention

The present invention relates to a method of growing lutetium oxyorthosilicate crystals and in particular to a method for growing such crystal for use as scintillator. The invention also provides improved scintillation detectors incorporating such crystals.

2. Description of the Prior Art

Cerium doped lutetium oxyorthosilicate crystals are known to be useful as scintillators for $\gamma$ ray and x-ray detectors. U.S. Pat. No. 4,958,080 and U.S. Pat. No. 5,025,151 (both incorporated herein by reference) describe a single crystal scintillator formed from a melt of formula $Ce_{2x}Lu_{2(1-x)}SiO_5$, wherein $2\times10^{-4}<x<3\times10^{-2}$ (hereinafter the term LSO will be used as shorthand for this formula). The method proposed for growing LSO is the Czochralski crystal growth method which is generally described in the publication CRYSTAL GROWTH: A TUTORIAL APPROACH, W. Bardsley, D. T. J. Hurle, J. B. Mullins (eds) North-Holland Publishing Company, 1979, pp 189–215. This method has been used for growing scintillator crystals as is described in "Growth and applications of $Gd_2SiO_5$:Ce scintillators" T. Utsu and S. Akiyama, Journal of Crystal Growth 109 (1991) 385–391 for gadolinium orthosilicate scintillators and in "Czochralski growth of rare earth oxyorthosilicate single crystals" C. L. Melcher, R. A. Manente, C. A. Peterson and J. S. Schweitzer, Journal of Crystal Growth 128 (1993) 1001–1005, and "A Macintosh-based System For Czochralski Crystal Growth" C. L. Melcher, R. A. Manente, C. A. Peterson, J. S. Schweitzer, M. A. Singelenberg and F. J. Bruni, Scientific Computing and Automation, January 1994 39–45 for LSO scintillators.

While these methods can be used to make scintillator crystals which are useful in certain applications, there is variability between the scintillation behavior of different crystals cut from a single boule of LSO. This variability has not been seen in any other property than the scintillation behavior, i.e. to all other intents and purposes, the boule appears to be homogenous, but the resulting crystals have $\gamma$-ray spectra with broad or multiple peaks. However, for spectroscopic uses of LSO crystal scintillators, it is desirable that the behavior be as uniform as possible.

It is an object of the present invention to provide a method for producing LSO crystals for use as scintillators which display substantially uniform scintillation behavior throughout the crystal.

It is another object of the present invention to provide an improved Czochralski crystal growth method for producing LSO crystals.

SUMMARY OF THE INVENTION

The present invention provides a method for producing LSO crystals in which the interface between a crystal and the melt from which it is pulled is maintained substantially flat as the crystal is grown. In a Czochralski growth method, the rate of rotation of the crystal and its diameter are typically controllable to provide the flat interface as the crystal is pulled.

The shape of the solid-to-liquid interface is determined by the shape of the freezing isotherm. Consequently, the objects of the invention are achieved by controlling the shape of the freezing isotherm during the main part of the crystal growth. There may be some variation from the desired conditions at the beginning and end of the growth. The thermal conditions are determined by crucible size and location in the heating environment, furnace design, insulating materials employed and flow pattern of the liquid melt. The flow pattern of the liquid melt is a function of melt viscosity, crystal diameter relative to crucible diameter and crystal rotation rate.

DESCRIPTION OF THE PREFERRED EMBODIMENT

Figure 1:
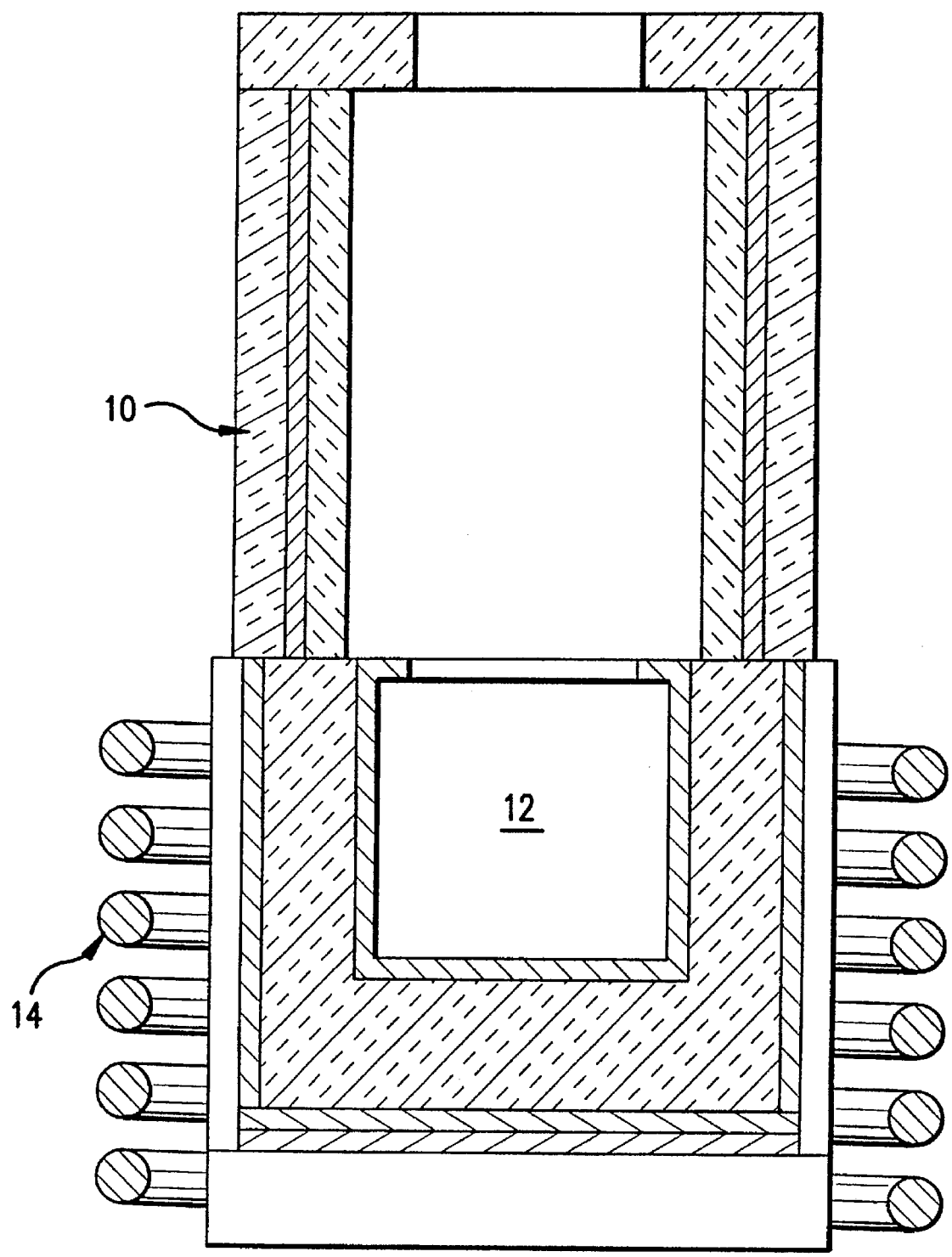
FIG. 1 shows a schematic view of a furnace used to produce LSO.

Crystal growth is carded out with a Czochralski crystal grower (CGS-5, Crystalox, Ltd.) which includes a furnace as shown in FIG. 1. The furnace comprises a housing 10 formed from refractory and insulating materials and having a 2" inner diameter iridium crucible 12 located therein (Engelhard Corp. see also U.S. Pat. No. 4,444,728). The housing includes an aperture for insertion of an iridium wire or seed crystal (not shown) into the crucible to act as a seed for the crystal. The wire can be rotated during crystal growth. A RF inductive heating coil 14 surrounds the housing at the level of the crucible 12. In use, the raw materials, $Lu_2O_3$, $SiO_2$ (dried at 1000° C.), and $CeO_2$ powders of preferably 99.99% purity are mixed in the appropriate proportions and pressed into pellets (where appropriate) and loaded into the crucible. The materials are then melted and the melt aged for a suitable period, e.g. 24 hours so as to stabilize the growth atmosphere. The melt typically has the formula $Ce_{2x}Lu_{2(1-x)}SiO_5$ where $2\times10^{-4}<x<6\times10^{-2}$ (a preferred range for x is $1\times10^{-3}-2\times10^{-2}$). Crystals are drawn from the melt using either a rotating seed crystal of LSO or a 1 mm iridium wire. The crystal boule is grown in a nitrogen atmosphere which can include a small amount of oxygen. During growth, the rate of rotation, temperature (RF power) and rate of pull of the crystal is controlled by the control system described in more detail below. The crystals are cooled to room temperature after pulling. This has been done over 48 hours although the cooling to room temperature over seven hours has been achieved without fracturing the crystal.

Figure 7:
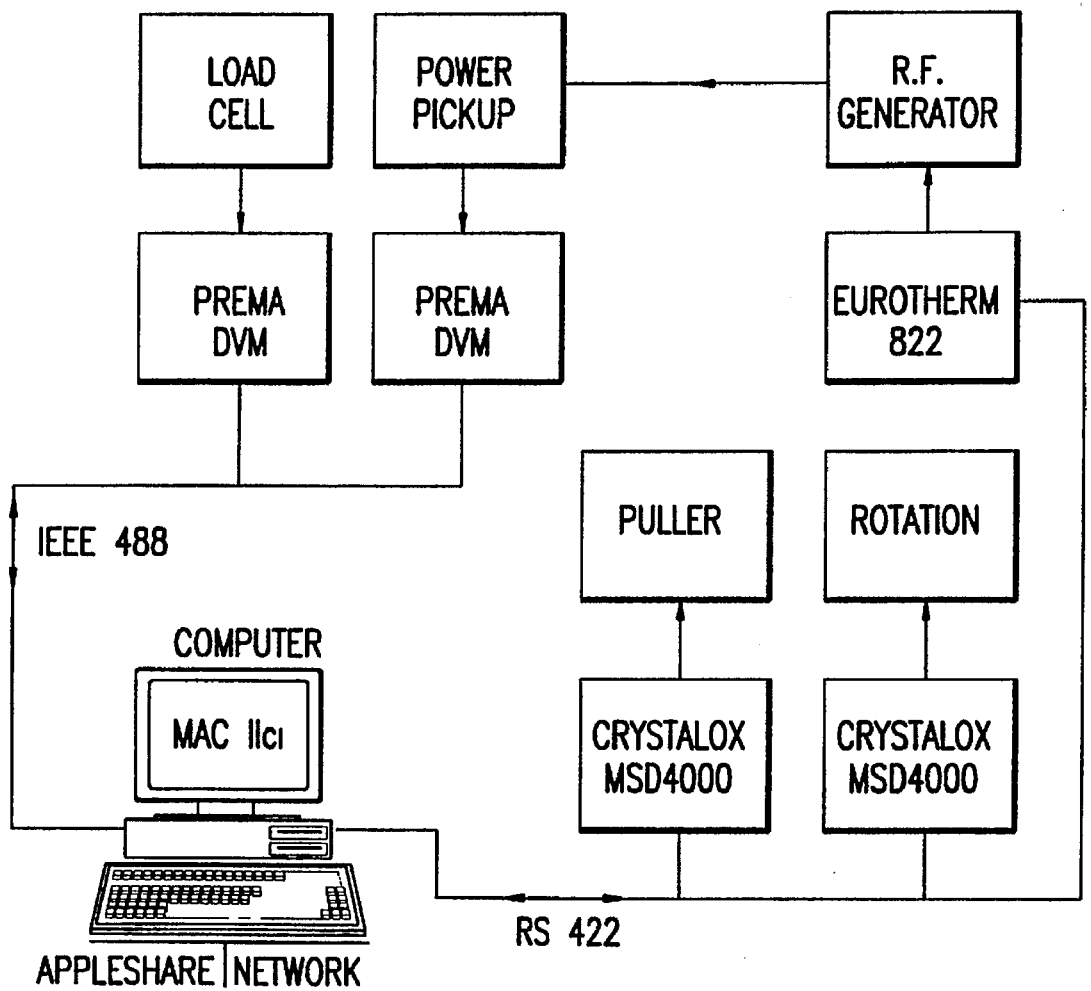
FIG. 7 shows a schematic drawing of hardware configuration for the crystal grower.

The growth system is shown schematically in FIG. 7 and contains a crucible load cell to permit automatic adjustment of the power level to maintain a specified crystal diameter during the growth process. The DOS-based software supplied by Crystalox to control the crystal growth process has been used to successfully grow crystal boules with desired dimensions. However, in order to improve real time observation of the control characteristics, access to archival data, and user friendliness, it is desirable to use Macintosh II computers running Lab VIEW 2.1.1 software (National Instruments) to control the process, including extensive software control of instruments. The basic premise of the program is automatic radius control (ARC), in which all the parameters connected with a specific operation should be visible and alterable on the same screen display. During the ARC mode, the measured and desired radius and % power are plotted on strip chart like displays that show approximately the 10 previous hours of data, when a control cycle time of 5 minutes is employed. Also plotted, are the present and average crucible weight, Length grown, predicted completion time, desired crystal profile and other parameters are also available. Data from times earlier than those shown on the display charts can be accessed quickly by "scrolling" the displays. Thus, all relevant data for a particular growth run can be accessed at any time during the growth process.

The Crystalox system uses both the IEEE 488 and RS 422 busses. Two Prema 6030 DVMs communicate by the IEEE bus and the Eurotherm 822 process controller and two Crystalox MSD 4000s communicate by the RS 422 bus (FIG. 7). The DVMs measure the voltages produced by the load cell which weighs the crucible and its contents and the power pick-up coil that monitors the R.F. generator output. Pulling speed and rotation rate are controlled by the MSD 4000s and the Stenelco generator power output is controlled by the Eurotherm 822 process controller. The controlling computer is a Macintosh IIci with a video monitor that has access to a network.

The digital to analog converter of the Eurotherm 822 has 10 bit resolution in the normal power operating region of about 70% of maximum power. This resolution seems sufficient when compared to the observed repeatability and stability of the Stenelco generator. DVM resolutions are 1 microvolt d.c. for the load cell and 10 microvolts a.c. for the power pick-up coil.

Control operates through a standard proportional-integral-derivative (PID) feedback loop. The controlled parameter is the RF generator power. The power at time t, P(t), is determined through the equation:

$$P(t) = P(0) + PG \cdot err + \int_0^t IG \cdot err \, dt + DG \cdot d(err)/dt \quad (1)$$

where P(0) is the power at time zero when automatic control is initiated, PG, IG, and DG are proportional, integral and derivative gains, respectively, and err is the instantaneous error in the crystal radius. It should be noted that in the current implementation of the software the derivative gain is always zero.

Since Czochralski growth is not a steady state process, trends are observed in the power over long periods. Calculating this trend (the base rate) and extrapolating forward in time has been shown to be helpful in maintaining precise control. Thus equation (1) is modified so that the base rate trend is added to the calculated power even for conditions of zero error. The error is defined to be the difference between the desired crystal radius and the measured crystal radius. The latter is calculated from the equation:

$$r = [(dW/dt)/\{Pr \cdot \pi \cdot ds + (dW/dt)/R^2 \cdot (dl/ds)\}]^{1/2} \quad (2)$$

where dW/dt is the first derivative of the crystal weight, Pr is the pull rate, R is the crucible radius, and ds and dl are the densities of the crystal and melt, respectively. The desired crystal radius is derived from an algorithm which calculates a smooth, monotonic increase in crystal radius from the initial seed diameter to the full body diameter, as well as a tail-off to zero radius at the end of the growth process. The second term in the denominator of equation (2) arises from the melt drop in the crucible.

The Crystalox pulling mechanism uses a micro-stepper motor and is controlled by a drive which permits incremental changes in pull rate with a precision of one part in 10,000.

Taking advantage of this feature, the software adjusts the pull rate of the crystal to maintain a constant, absolute growth rate throughout the process. The pull rate is lowered during the growth from seed diameter to full diameter to compensate for the change in melt drop rate as the crystal radius changes.

Ideally, the crystal radius would be calculated from the value of dW/dt by using a moving window of weight readings as a function of time. In the current system, however, the crucible experiences a levitation effect from the induction heating coil which varies as the generator power is adjusted through equation (1). Thus, weight and time values must be collected over a time base during which no power adjustments are made. In the current application, a time base of 5 minutes is used with weight readings taken at 4 second intervals. This is the same technique used by the proprietary Crystalox software and it produces very adequate results.

Because of the levitation effect on the crucible, as noted above, weight readings cannot extend beyond the selected time base. As a consequence, dW/dt (and the value of crystal radius calculated from it) can be quite noisy. Much of the noise in this signal can be removed through the use of a digital filter of the type:

$$FP_i = R_i \cdot f + (1-f) \cdot FP_{i-1} \quad (3)$$

where $FP_i$ is the value of the filtered parameter at time i, $R_i$ is the reading at time i and f is the digital filter. The value of f lies between zero and one. Inspection of equation (3) shows that a filter of zero passes no information and a value of one is equivalent to an unfiltered signal. This equation yields an exponentially weighted average of the measured parameter. It has been shown to be ideal for removing Gaussian noise. The software could easily be modified to employ this type of digital filtering in a number of places so that displayed values of crystal weight and radius are smoothed considerably from their calculated values. To ensure rapid response of the control system, however, unfiltered values should still be used exclusively in the control algorithm.

LSO has a density of 7.41 g/cm$^3$ and a melting point of approximately 2100° Celsius. The following data are from crystals grown in a nitrogen atmosphere with 0.3% oxygen from an iridium wire or a seed crystal obtained from a previous growth process.

| Boule No. | Mol % Ce | Seed | Growth rate | Diameter | Rotation rate | Interface |
|---|---|---|---|---|---|---|
| LSO10 | 0.5 | Iridium wire | 0.5 mm/hr | 20 mm | 20 rpm | convex |
| LSO15 | 2.5 | Iridium wire | 1.0 mm/hr | 20 mm | 20 rpm | convex |
| LSO17 | 2.45 | Iridium wire | 1.0 mm/hr | 20 mm | 65 rpm | frusto-conical |
| LSO27 | 0.25 | LSO seed | 0.5 mm/hr | 26 mm | 59 rpm | flat |
| LSO28 | 1.0 | LSO seed | 2.0 mm/hr | 26 mm | 59 rpm | flat |

The shape of the boules and the γ ray spectrum from $^{137}$Cs for each of these are shown in FIGS. 2–6. From the table above, it can be seen that the desired effect can be obtained by adjusting the boule diameter and rotation rate. The actual diameter and rate required are dependent on the size and geometry of the crucible used (2" in the present case).

Figure 2A:
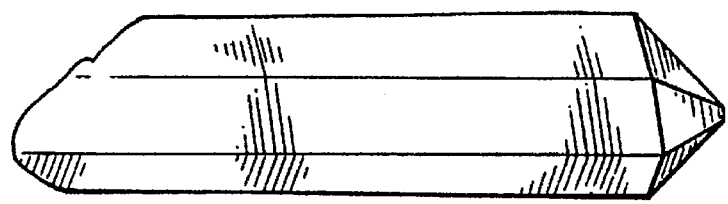
FIGS. 2a and 2b, 3a and 3b, 4a and 4b, 5a and 5b, and 6a and 6b show the shape of a crystal and its $\gamma$ ray spectrum for different growth conditions.
Figure 2B:
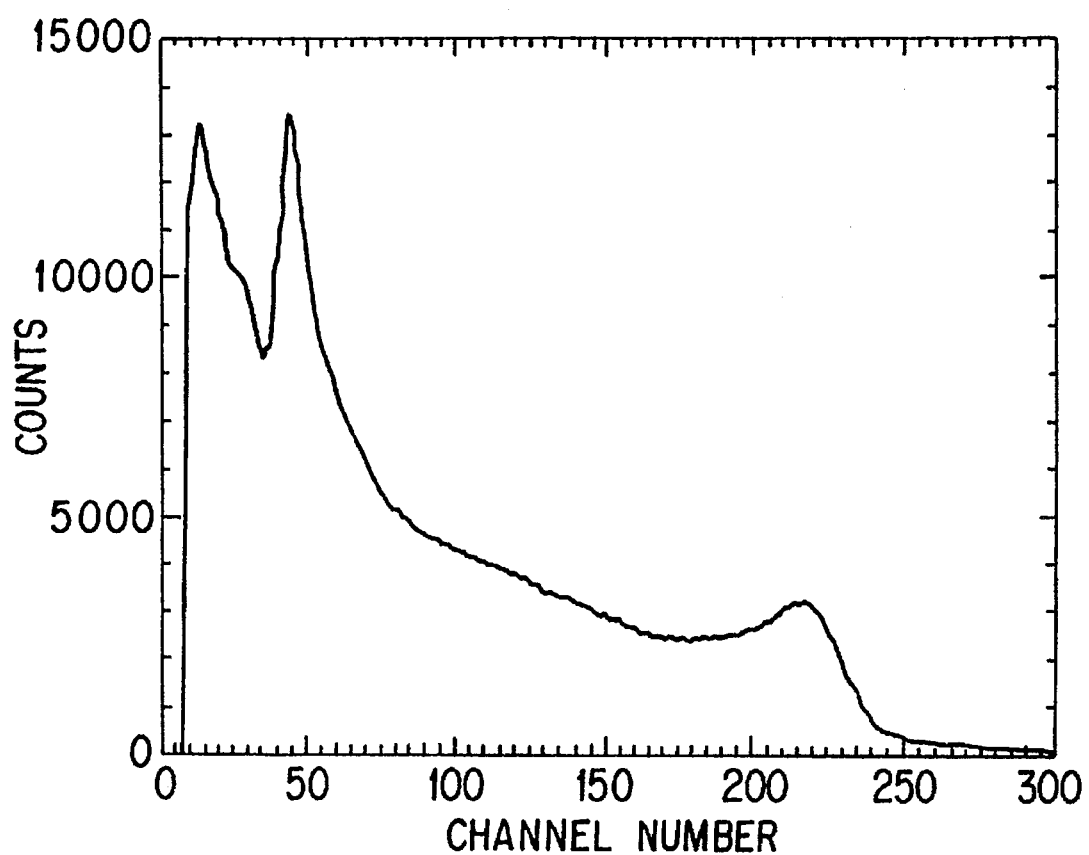
Figure 3A:
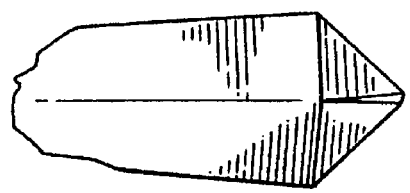
Figure 3B:
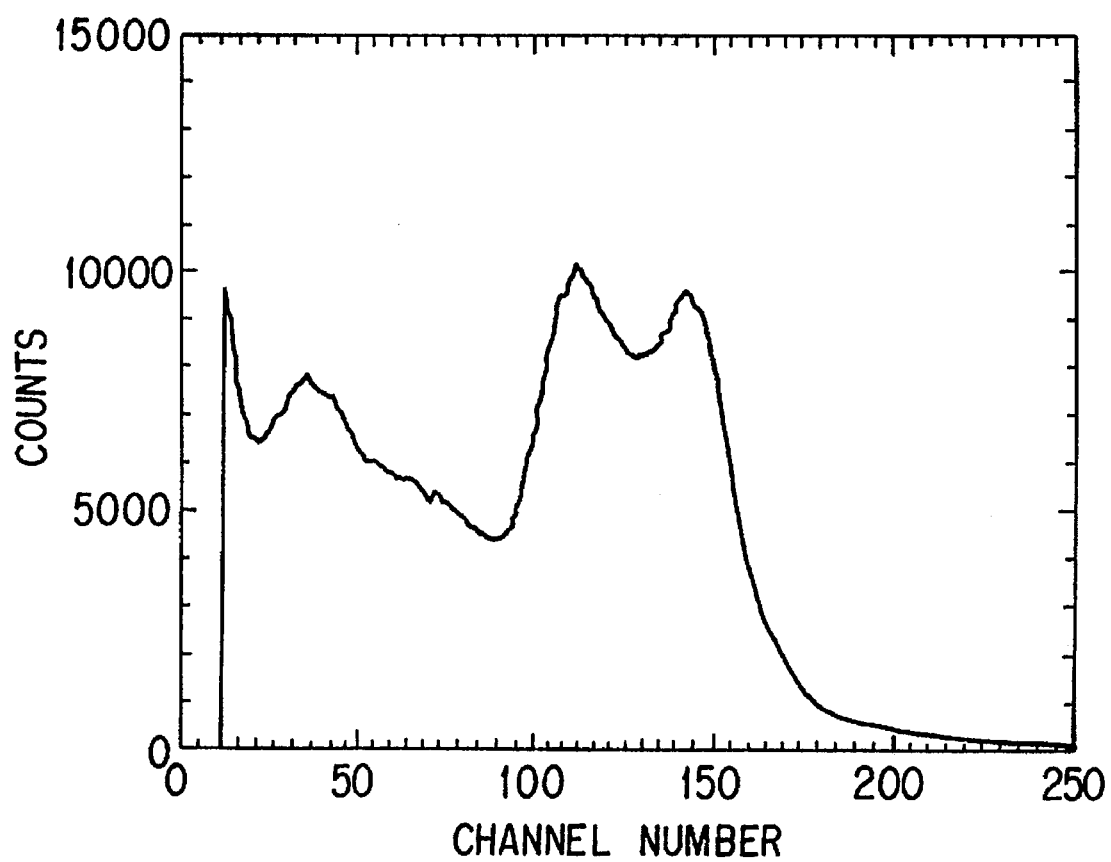
Figure 4A:
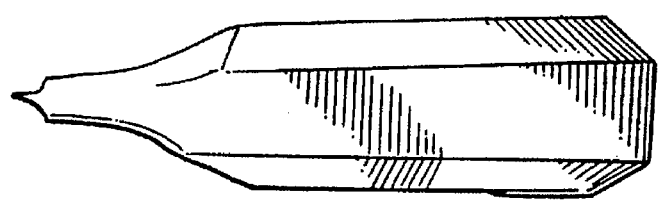
Figure 4B:
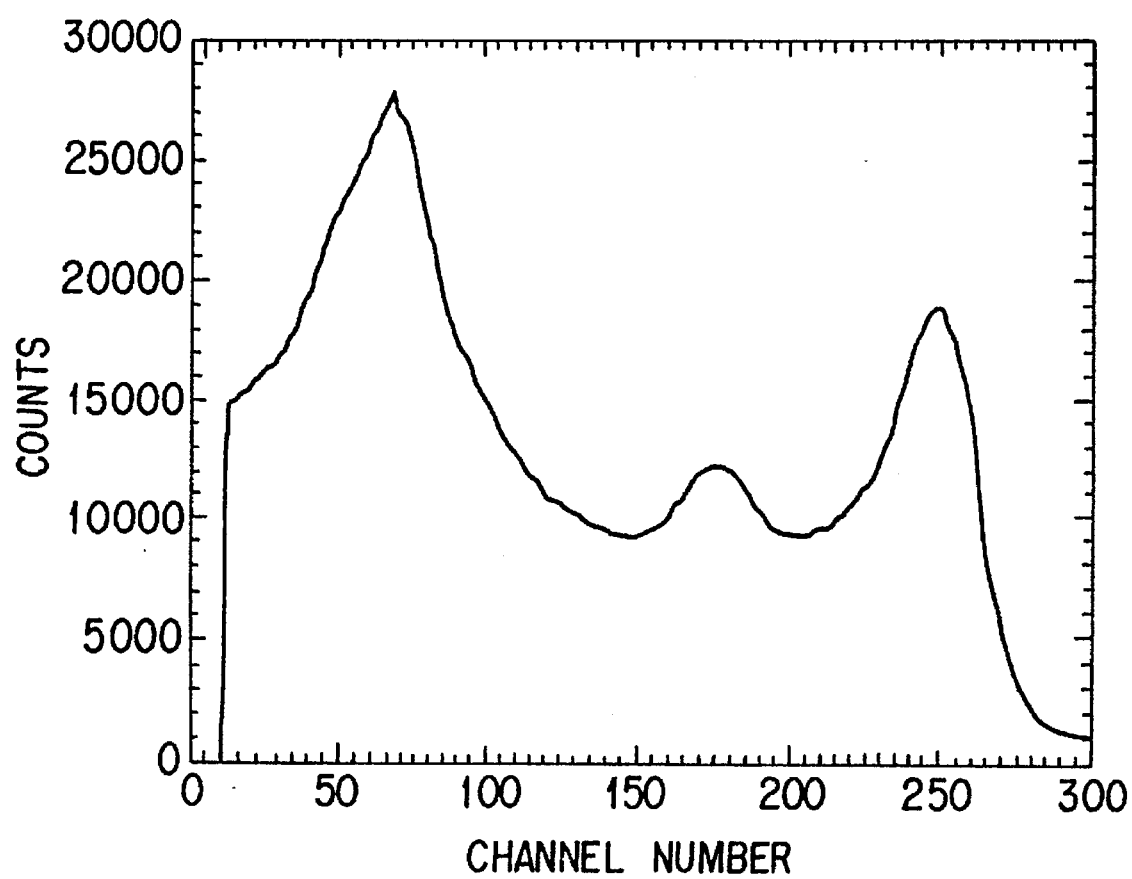

In FIGS. 2–4, which show spectra from crystals Which were not grown with a flat interface, the γ ray spectra exhibit large variability even though the radiation source is the same in each case. The spectra shown comprise the summation of many spectra with varying light output and are due to the inhomogeneity in the LSO crystal.

Figure 5A:
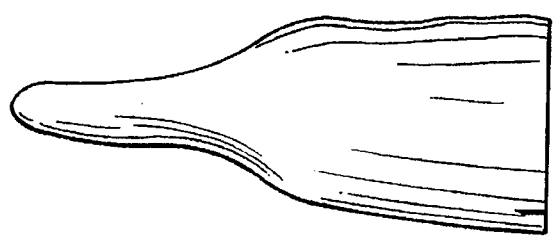
Figure 5B:
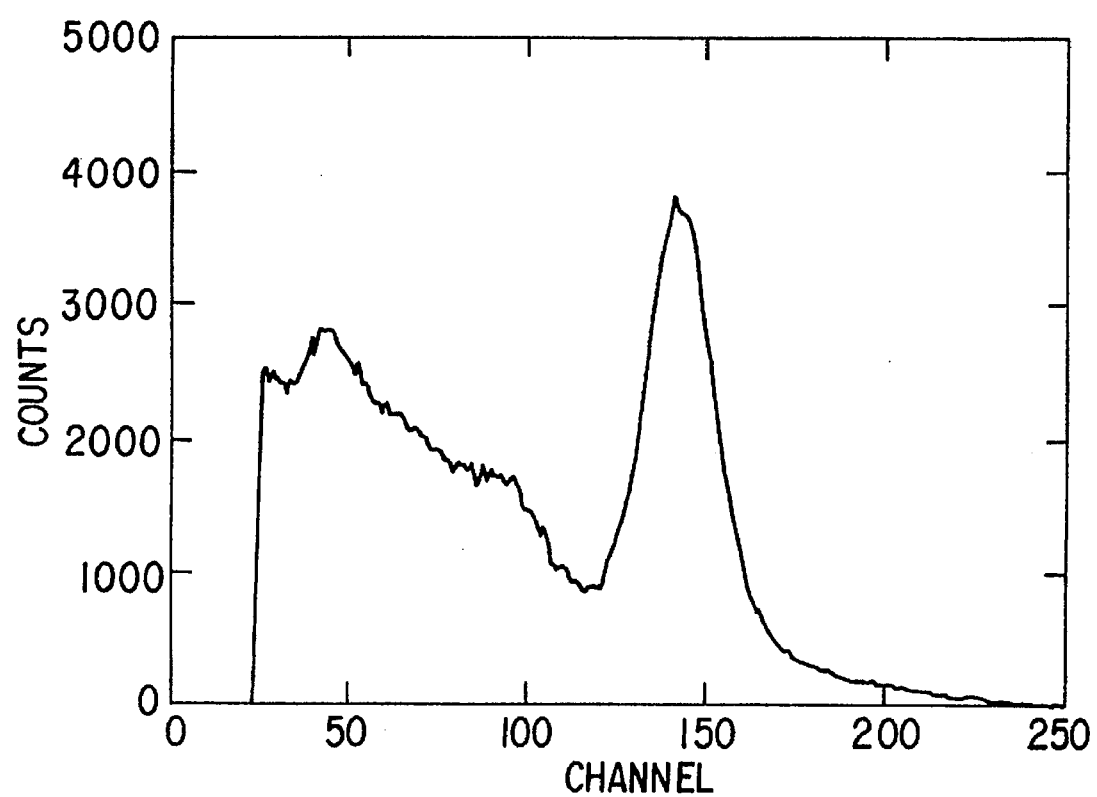
Figure 6A:
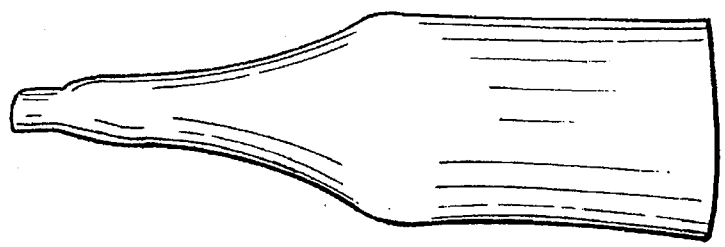
Figure 6B:
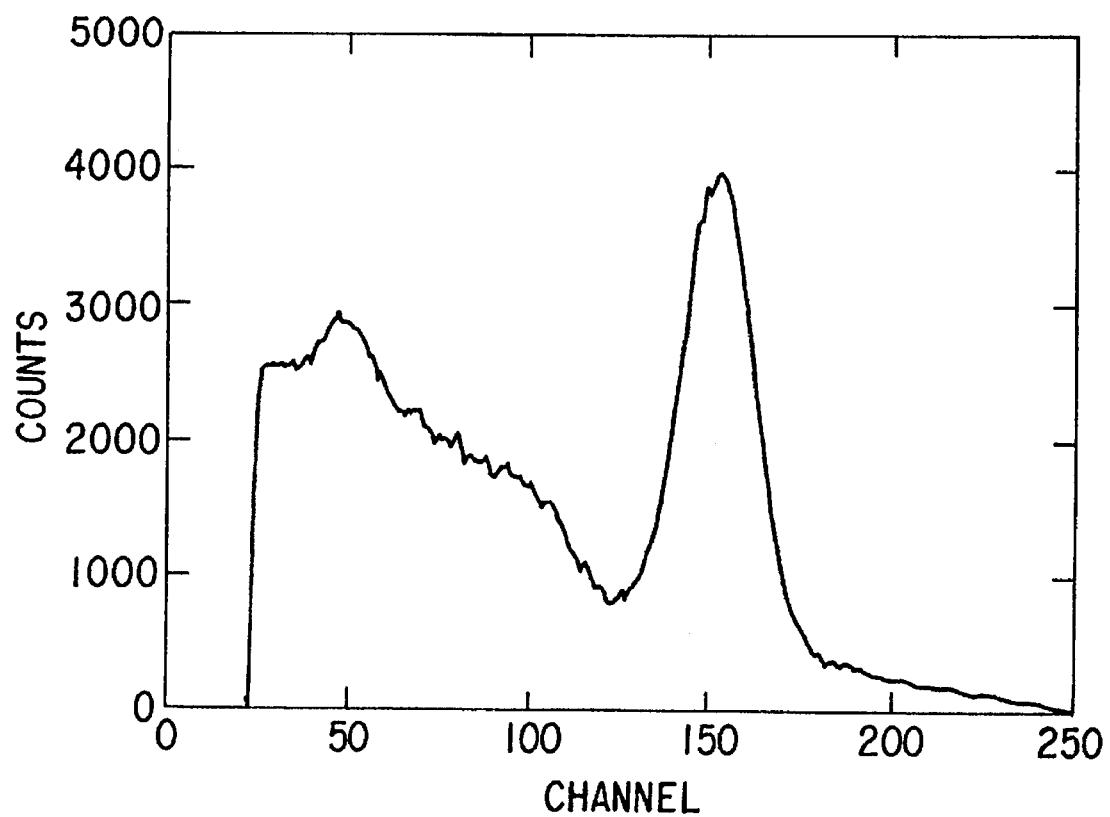

FIGS. 5 and 6 which show the spectra for crystals grown with a flat interface, substantially similar spectra are shown despite the different growth conditions and composition.

Figure 8:
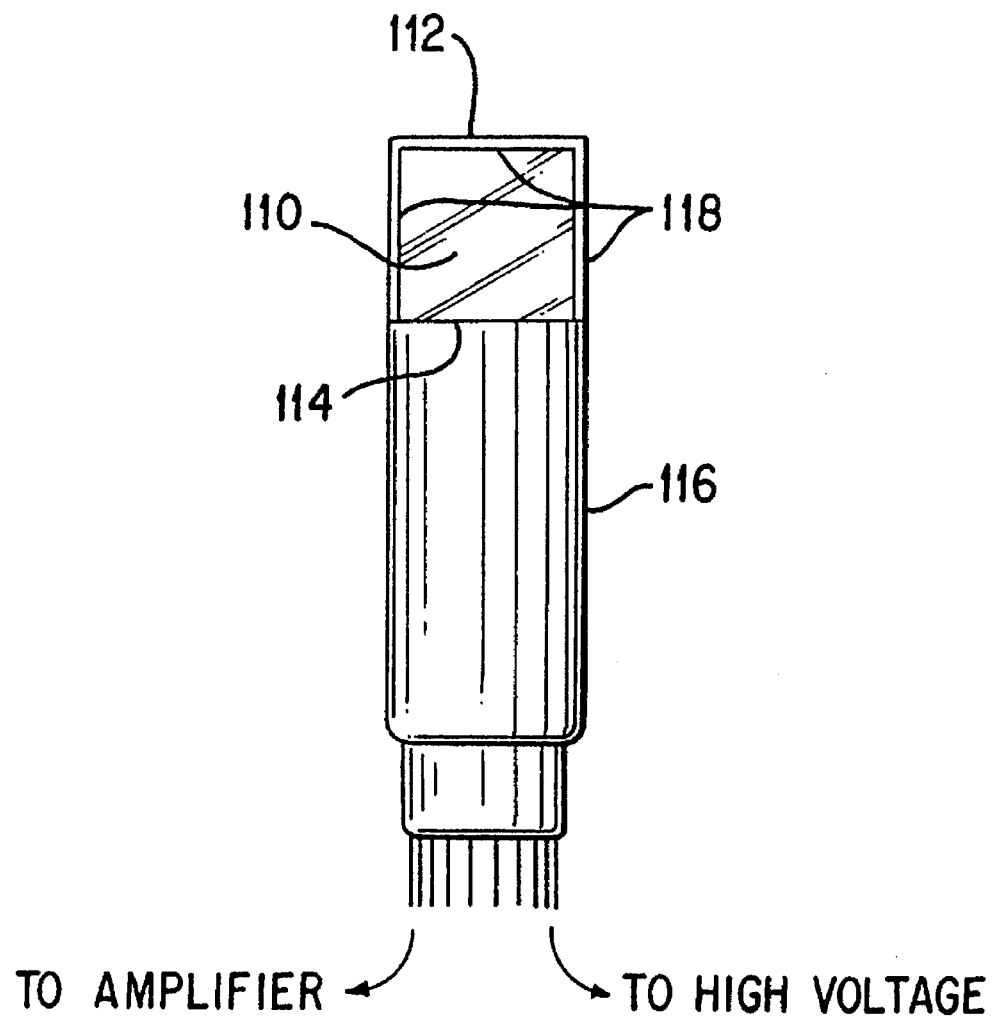
FIG. 8 shows a gamma ray detector incorporating a scintillator according to the invention.

FIG. 8 shows a diagrammatic view of an LSO scintillation detector in which the LSO produced according to the above described method can be used. In FIG. 8 a single crystal LSO scintillator 110 is shown encased within the housing 112 of a gamma ray detector. One face 114 of the scintillator is placed in optical contact with the photosensitive surface of a photomultiplier tube 116. Alternatively, the light pulses could be coupled to the photomultiplier via light guides or fibers, lenses, mirrors, or the like. The photomultiplier can be replaced by any suitable photodetector such as a photodiode, microchannel plate, etc. In order to direct as much of each light flash to the photomultiplier as possible, the other faces 118 of the scintillator are preferably surrounded or covered with a reflective material, e.g. Teflon tape, magnesium oxide powder, aluminum foil, or titanium dioxide paint. Light pulses emitted by the LSO crystal upon the incidence of radiation are intercepted, either directly or upon reflection from the surfaces 118, by the photomultiplier, which generates electrical pulses or signals in response to the light pulses. These electrical output pulses are typically first amplified and then subsequently processed as desired, e.g. in a pulse height amplifier, to obtain the parameters of interest regarding the detected radiation. The photomultiplier is also connected to a high voltage power supply, as indicated in FIG. 8. Other than the LSO scintillator, all of the components and materials referred to in connection with FIG. 8 are conventional and thus need not be described in detail.

The LSO scintillator detector of FIG. 8 is particularly effective as a radiation detector in a borehole logging environment, such as for petroleum exploration. In such use, the detector forms part of a logging system which may be of the type illustrated in FIG. 9 herein.

Figure 9:
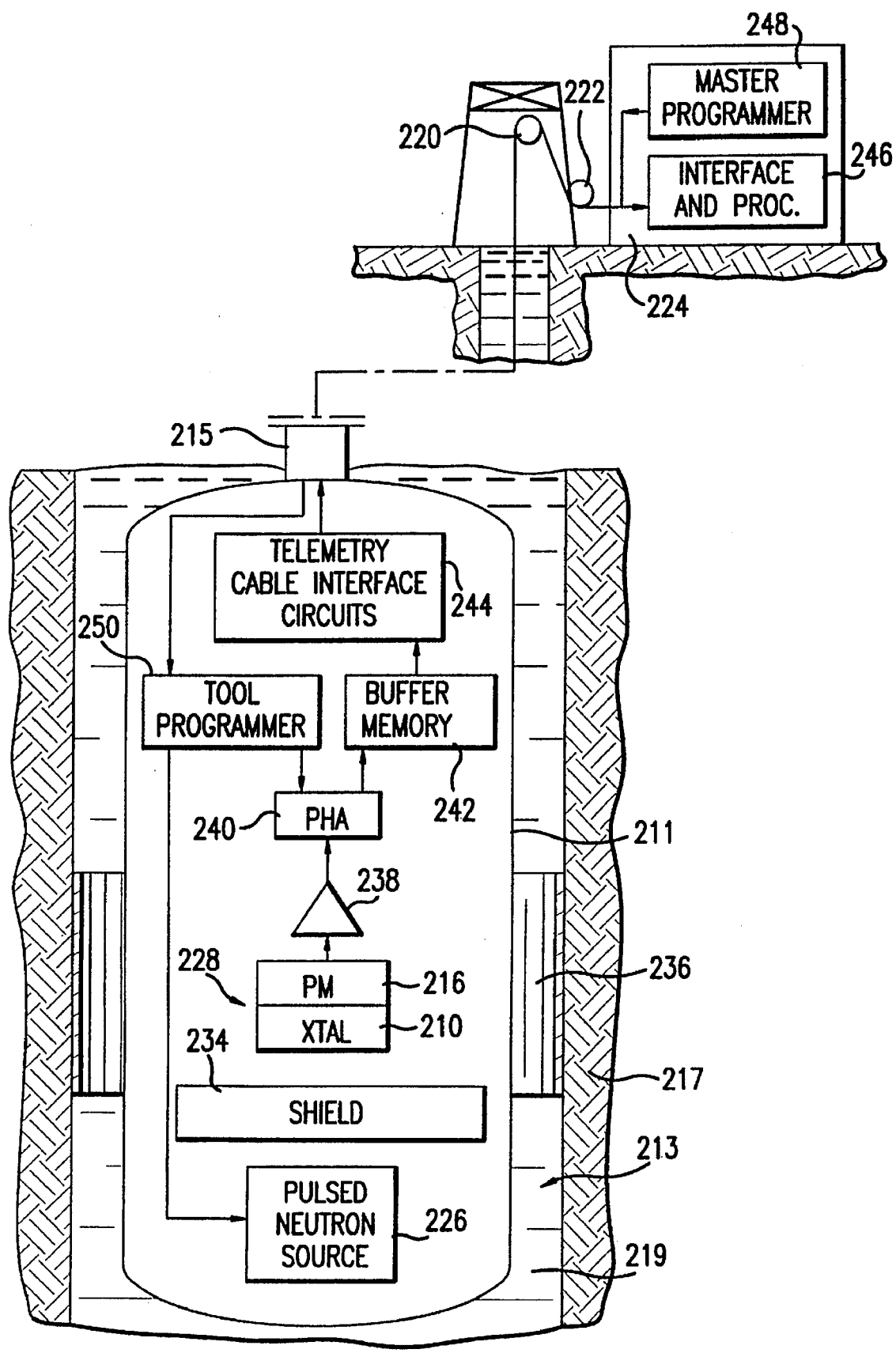
FIG. 9 shows a borehole logging tool incorporating a detector as shown in FIG. 8.

FIG. 9 shows a logging sonde 211 for sensing gamma radiation resulting from bombardment of a formation with high energy neutrons and detecting the energy of the radiation for subsequent spectral analysis. The sonde 211 is suspended in a borehole 213 on an armored multiconductor cable 215. The borehole 213 traverses a formation 217 and is filled with fluid 219, and may be open as shown or cased. The sonde 211 as described below may be constructed in accordance with U.S. Pat. No. 4,317,993 to Hertzog, Jr. et al. assigned to the assignee of the present application. The sonde 211 is moved in the borehole 213 by playing the cable 215 out and reeling it back in over a sheave wheel 220 and a depth gauge 222 by means of a winch forming part of surface equipment 224. Usually the logging measurements are actually made while the sonde 211 is being raised back up the borehole 213, although in certain circumstances they may be made on the way down instead or as well.

The sonde 211 includes a pulsed neutron source 226 for producing primary radiation to bombard the formation 217 with fast neutrons as the sonde 211 travels up the borehole 213, and a radiation detector 228 for detecting secondary (gamma) radiation induced thereby in the borehole 213 and the formation 217. The neutron source 226 is preferably of the pulsed accelerator type described in U.S. Pat. No. 3,461,291 to Goodman and U.S. Pat. No. 3,546,512 to Frentrop, both commonly owned with this application. This type of source is particularly suited to the generation of discrete bursts of high energy or fast neutrons, e.g. at 14 MeV, with a controlled duration and repetition rate.

The detector 228 is of a type appropriate to the detection of gamma radiation and the production of an electrical signal corresponding to each detected gamma ray and having an amplitude representative of the energy of the gamma ray. To this end the detector 228 is shown in FIG. 8 including a cerium-activated LSO scintillation crystal 210 optically coupled to a photomultiplier tube (PMT) 216. Suitable tubes are manufactured by EMR Photoelectric, Princeton, N.J.

A neutron shield 234 may be located between the source 226 and the detector 228 to limit direct bombardment of the detector 228 by neutrons from the source 226, thereby avoiding saturation of the detector 228 by such direct irradiation. In addition, especially in the case of measurement of capture gamma radiation, the sonde 211 may be surrounded by a sleeve 236 impregnated with boron carbide and located in the general vicinity of the source 226 and the detector 228. This sleeve displaces borehole fluid in the region of the detector 228, and absorbs neutrons scattered by the formation towards the detector 228, without significantly attenuating gamma radiation emanating from the formation. The net effect is to reduce the possibility of neutron interactions with the borehole contents and the material of the sonde 211 in proximity to the detector 228 and which would otherwise produce detectable gamma rays constituting an undesirable perturbation of the required gamma ray measurement.

Electrical power for the sonde 211 is supplied via the cable 215 from the surface equipment 224. The sonde 211 includes power conditioning circuitry (not shown) for feeding power at appropriate voltage and current levels to the source 226, the detector 228 and other downhole circuits. These circuits include an amplifier 238 and associated circuitry which receives the output pulses from the PMT 216. The amplified pulses are then applied to a pulse height analyzer (PHA) 240 including an analog-to-digital converter which may be of any conventional type such as the single ramp (Wilkinson rundown) type. Other suitable analog to digital converters may be used for the gamma ray energy range to be analyzed. Linear gating circuits may also be employed for control of the time portion of the detector signal frame to be analyzed. Improved performance can be obtained by the use of additional conventional techniques such as pulse pile-up rejection.

The pulse height analyzer 240 assigns each detector pulse to one of a number (typically in the range 256 to 8000) of predetermined channels according to its amplitude (i.e. the gamma ray energy), and produces a signal in suitable digital form representing the channel or amplitude of each analyzed pulse. Typically the pulse height analyzer 240 includes memory in which the occurrences of each channel number in the digital signal are accumulated to provide an energy spectrum. The accumulated totals are then transferred via a buffer memory 242 (which can be omitted in certain circumstances) to telemetry and cable interface circuits 244 for transmission over the cable 215 to the surface equipment 224.

At the surface the cable signals are received by cable interface and signal processing circuits 246. It will be understood that the circuits 244 and 246 may be of any suitable known construction for encoding and decoding, multiplexing and demultiplexing, amplifying and otherwise processing the signals for transmission to and reception by the surface equipment 224. Appropriate circuits are described, for example, in U.S. Pat. No. 4,012,712 to Nelligan.

The operation of the sonde 211 is controlled by signals sent downhole from a master programmer 248, located in the surface equipment 224. These signals are received by a tool programmer 250 which transmits control signals to the neutron source 226 and the pulse height analyzer 240.

The surface equipment 224 includes various electronic circuits used to process the data received from the downhole equipment, analyze the energy spectrum of the detected gamma radiation, extract therefrom information about the formation 217 and any hydrocarbons that it may contain, and produce a tangible record or log of some or all of this data and information, for example on film, paper or tape. These circuits may comprise special purpose hardware or alternatively a general purpose computer appropriately programmed to perform the same tasks as such hardware. Details of such analysis form no part of this invention and will not be described here, but may be found for example in U.S. Pat. No. 3,521,064.

We claim:

1. A method of growing lutetium oxyorthosilicate crystals comprising forming a melt of lutetium oxyorthosilicate and drawing a crystal therefrom while maintaining an interface between the crystal and the melt which is substantially flat.

2. A method as claimed in claim 1, which comprises a Czochralski crystal growth method.

3. A method as claimed in claim 1, wherein the lutetium oxyorthosilicate melt has the formula $Ce_{2x}Lu_{2(1-x)}SiO_5$, wherein $2\times10^{-4} < x < 6\times10^{-2}$.

4. A method of producing scintillator crystals comprising forming a melt of lutetium oxyorthosilicate, drawing a lutetium oxyorthosilicate boule therefrom while maintaining an interface between the boule and the melt which is substantially flat, and subdividing the boule to form individual scintillator crystals.

5. A method as claimed in claim 4, which comprises a Czochralski crystal growth method.

6. A method as claimed in claim 4, wherein the lutetium oxyorthosilicate melt has the formula $Ce_{2x}Lu_{2(1-x)}SiO_5$, wherein $2\times10^{-4} < x < 6\times10^{-2}$.

7. A Czochralski crystal growth method for producing lutetium oxyorthosilicate crystals comprising forming a melt of lutetium oxyorthosilicate and drawing a crystal therefrom while rotating the crystal and controlling the rate of rotation and the diameter of the crystal so as to maintain an interface between the crystal and the melt which is substantially flat.

8. A method as claimed in claim 8, wherein the lutetium oxyorthosilicate crystal comprises a boule from which individual scintillator crystal are formed.

9. A method as claimed in claim 8, wherein the lutetium oxyorthosilicate melt has the formula $Ce_{2x}Lu_{2(1-x)}SiO_5$, wherein $2\times10^{-4} < x < 6\times10^{-2}$.

10. Lutetium oxyorthosilicate when produced by a method comprising forming a melt of lutetium oxyorthosilicate and drawing a crystal therefrom while maintaining an interface between the crystal and the melt which is substantially flat.

11. Lutetium oxyorthosilicate as claimed in claim 10, wherein the melt has the formula $Ce_{2x}Lu_{2(1-x)}SiO_5$, wherein $2\times10^{-4} < x < 6\times10^{-2}$.

12. Lutetium oxyorthosilicate as claimed in claim 10 when produced by a Czochralski crystal growth technique.

* * * * *